United States Patent
Marinaro et al.

(10) Patent No.: US 6,361,599 B1
(45) Date of Patent: Mar. 26, 2002

(54) MECHANISM FOR DISPENSING LIQUID ONTO AN INTEGRATED CIRCUIT WAFER WITH MINIMIZED BACK-SPLASH

(75) Inventors: Vincent L. Marinaro, Sunnyvale; Eric R. Kent, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,821

(22) Filed: Feb. 12, 2001

Related U.S. Application Data

(62) Division of application No. 09/390,934, filed on Sep. 7, 1999, now Pat. No. 6,238,747.

(51) Int. Cl.⁷ .............................................. B05C 5/02
(52) U.S. Cl. ........................... 118/52; 118/56; 118/315; 118/319; 118/320
(58) Field of Search .............................. 118/52, 56, 411, 118/412, 416, 315, 319, 320; 427/240, 425

(56) References Cited

U.S. PATENT DOCUMENTS

| | | | | |
|---|---|---|---|---|
| 5,626,913 A | * | 5/1997 | Tomoeda et al. | 427/299 |
| 5,779,816 A | * | 7/1998 | Trinh | 134/23 |
| 5,954,877 A | * | 9/1999 | Hayes | 118/319 |
| 5,972,426 A | * | 10/1999 | Kutsuzawa et al. | 427/240 |
| 6,012,858 A | * | 1/2000 | Konishi et al. | 396/611 |
| 6,159,296 A | * | 12/2000 | Aoyama et al. | 118/695 |
| 6,287,178 B1 | * | 9/2001 | Huynh et al. | 451/73 |

* cited by examiner

Primary Examiner—Laura Edwards
(74) Attorney, Agent, or Firm—Monica H. Choi

(57) ABSTRACT

A mechanism for effectively dispensing liquid onto a surface of an IC (Integrated Circuit) wafer with minimized back-splash. A nozzle includes a liquid chamber that fills up with the liquid to be dispensed onto the surface of the IC wafer, and the nozzle includes a plurality of nozzle passages. A nozzle passage carries and directs the liquid from the liquid chamber toward the surface of the IC wafer to provide a respective liquid stream from a respective location on the nozzle to a respective spot on the surface of the IC wafer as the IC wafer is spinning. A nozzle passage is disposed within the nozzle at a respective angle with respect to the surface of the IC wafer such that the respective liquid stream from the nozzle passage is directed toward a velocity vector at the respective spot on the surface of the IC wafer where the respective liquid stream hits the surface of the IC wafer. For example, the respective angle of the nozzle passage with respect to the surface of the IC wafer may be 45°. The angling of the liquid stream toward the velocity vector on the IC wafer as the IC wafer spins reduces back-splash when the liquid stream hits the IC wafer. In addition, the liquid stream may be applied onto the surface of the IC wafer with relatively low pressure. Thus, the nozzle of the present invention dispenses liquid onto the surface of the IC wafer with minimized back-splash to reduce bubble defects within the integrated circuit fabricated on the surface of the IC wafer.

11 Claims, 5 Drawing Sheets

MECHANISM FOR DISPENSING LIQUID ONTO AN INTEGRATED CIRCUIT WAFER WITH MINIMIZED BACK-SPLASH

This is a divisional of an earlier filed patent application, with Ser. No. 09/390,934 filed on Sep. 7, 1999, now U.S. Pat. No. 6,238,747, for which priority is claimed. This earlier filed patent application with Ser. No. 09/390,934 is in its entirety incorporated herewith by reference.

TECHNICAL FIELD

The present invention relates generally to IC (Integrated Circuit) wafer fabrication systems, and more particularly, to a mechanism for dispensing liquid onto the IC wafer with minimized back-splash to reduce bubble defects during fabrication of integrated circuits on the IC wafers.

BACKGROUND OF THE INVENTION

Referring to FIG. 1, liquid such as solution used for fabrication of integrated circuits on an IC (Integrated Circuit) wafer 102 is dispensed from a nozzle 104 of the prior art onto a surface 103 of the IC wafer 102 as the IC wafer 102 spins. FIG. 1 shows a top view of the nozzle 104 placed across the diameter of the surface 103 of the IC wafer 102. FIG. 2 shows a side view of the nozzle 104 that is placed across the diameter of the surface 103 of the IC wafer 102 of FIG. 1. Elements having the same reference number in FIGS. 1 and 2 refer to elements having similar structure and function.

Referring to FIGS. 1 and 2, the nozzle 104 of the prior art includes a liquid chamber 106 that fills up with the liquid to be dispensed onto the surface 103 of the IC wafer 102. In addition, the nozzle 104 of the prior art includes a plurality of nozzle passages that carry and direct the liquid from the liquid chamber 106 onto the surface 103 of the IC wafer 102. The nozzle 104 includes a first nozzle passage 112, a second nozzle passage 114, a third nozzle passage 116, a fourth nozzle passage 118, a fifth nozzle passage 120, a sixth nozzle passage 122, and a seventh nozzle passage 124. (Note that the plurality of nozzle passages 112, 114, 116, 118, 120, 122, and 124 in FIGS. 1 and 2 are shown to be relatively large for clarity of illustration. However, a typical size of the each of the nozzle passages 112, 114, 116, 118, 120, 122, and 124 is approximately 0.5 millimeters).

These plurality of nozzle passages 112, 114, 116, 118, 120, 122, and 124 in the nozzle 104 of the prior art are directed vertically downward to be perpendicular to the surface 103 of the IC wafer 102. Each of these nozzle passages 112, 114, 116, 118, 120, 122, and 124 in the nozzle 104 of the prior art directs a respective liquid stream of the liquid from the liquid chamber 106 toward the surface 103 of the IC wafer 102 as the IC wafer 102 spins (for example in the clockwise direction as illustrated in FIGS. 1 and 2).

Thus, the first nozzle passage 112 carries and directs a first liquid stream 113 from the liquid chamber 106 toward the surface 103 of the IC wafer 102. Similarly, the second nozzle passage 114 carries and directs a second liquid stream 115 from the liquid chamber 106 toward the surface 103 of the IC wafer 102. The third nozzle passage 116 carries and directs a third liquid stream 117 from the liquid chamber 106 toward the surface 103 of the IC wafer 102. The fourth nozzle passage 118 carries and directs a fourth liquid stream 119 from the liquid chamber 106 toward the surface 103 of the IC wafer 102. The fifth nozzle passage 120 carries and directs a fifth liquid stream 121 from the liquid chamber 106 toward the surface 103 of the IC wafer 102. The sixth nozzle passage 122 carries and directs a sixth liquid stream 123 from the liquid chamber 106 toward the surface 103 of the IC wafer 102. The seventh nozzle passage 124 carries and directs a seventh liquid stream 125 from the liquid chamber 106 toward the surface 103 of the IC wafer 102.

In the prior art, each of these liquid streams 113, 115, 117, 119, 121, 123, and 125 is directed vertically downward to be perpendicular to the surface 103 of the IC wafer 102 as the IC wafer 102 spins. In addition, in the prior art, each of these liquid streams 113, 115, 117, 119, 121, 123, and 125 is typically dispensed aggressively onto the surface 103 of the IC wafer 102 with much pressure.

Unfortunately in the prior art, a relatively large amount of back-splash of liquid dispensed onto the surface 103 of the IC wafer 102 results. Referring to FIG. 2, a layer of liquid 130 is dispensed onto the surface 103 of the IC wafer 102 from the nozzle of the prior art 104. The surface 103 of the wafer 102 may have a layer of another material already deposited thereon. For example, the surface 103 of the wafer 102 may have a layer of photoresist 132 deposited thereon, and the layer of liquid 130 dispensed onto the IC wafer 102 may be developer solution for developing the layer of photoresist 132.

Referring to FIG. 2, as the liquid streams 113, 115, 117, 119, 121, 123, and 125 are aggressively directed vertically downward toward the IC wafer 102 to be perpendicular to the surface 103 of the IC wafer 102, back-splash of the liquid from the layer of liquid 130 on the IC wafer 102 results. With such back-splash, the liquid from the layer of liquid 130 bounce back up and away from the IC wafer 102, and bubbles form within the layer of liquid 130 on the IC wafer 102. Examples of such bubbles 140, 142, 144, and 146 are shown in FIG. 2 within the layer of liquid 130 on the IC wafer 102.

Such bubbles 140, 142, 144, and 146 are more prone to form with the nozzle 104 of the prior art because the liquid streams are directed toward the IC wafer 102 with relatively high pressure. In addition, such bubbles 140, 142, 144, and 146 are more prone to form with the nozzle 104 of the prior art because the liquid streams are directed vertically downward toward the IC wafer 102 to be perpendicular to the surface 103 of the IC wafer 102 as the IC wafer 102 is spinning. The velocity of the IC wafer 102 as the IC wafer 102 is spinning creates a force against a liquid stream when the liquid stream contacts the IC wafer 102, and such force contributes to the back-splash of the liquid when the liquid stream contacts the layer of liquid 130.

A bubble is located at a respective location within the layer of liquid 130 directly above the IC wafer 102, and such a bubble causes that respective location of the IC wafer 102 to be exposed to a low volume of liquid of the layer of liquid 130. However, proper exposure of the IC wafer 102 to a sufficient amount of liquid of the layer of liquid 130 dispensed onto the wafer 102 is desired for proper fabrication of integrated circuit structures on the IC wafer 102. With a bubble within the layer of liquid 130, the respective location of the IC wafer 102 having the bubble thereon may not be exposed to a sufficient volume of liquid of the layer of liquid 130. Such insufficient volume of liquid of the layer of liquid 130 at that location of the IC wafer 102 results in an integrated circuit defect at that location of the IC wafer 102, and such an integrated circuit defect may be referred to as a "bubble defect."

Furthermore, a long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions. Referring to FIG. 2, as IC dimensions are further scaled down to submicron and nanometer dimensions, a bubble formed within the layer of liquid 130 is more likely to cause defects within integrated circuit structures with such scaled down dimensions on the IC wafer 102.

Thus, to generally minimize defects within integrated circuits on the IC wafer 102, and further in light of the importance of scaling down IC dimensions, a mechanism is desired for effectively dispensing liquid onto the IC wafer with minimized back-splash to reduce bubble defects during fabrication of integrated circuits on the IC wafers.

SUMMARY OF THE INVENTION

Accordingly, a general aspect of the present invention includes a nozzle apparatus and method for effectively dispensing liquid onto a surface of an IC (Integrated Circuit) wafer with minimized back-splash.

In one embodiment of the present invention, a nozzle includes a liquid chamber that fills up with the liquid to be dispensed onto the surface of the IC wafer, and the nozzle includes a plurality of nozzle passages. A nozzle passage carries and directs the liquid from the liquid chamber toward the surface of the IC wafer to provide a respective liquid stream from a respective location on the nozzle to a respective spot on the surface of the IC wafer as the IC wafer is spinning. In addition, according to a general aspect of the present invention, a nozzle passage is disposed within the nozzle at a respective angle with respect to the surface of the IC wafer such that the respective liquid stream from the nozzle passage is directed toward a velocity vector at the respective spot on the surface of the IC wafer where the respective liquid stream hits the surface of the IC wafer. For example, the respective angle of the nozzle passage with respect to the surface of the IC wafer may be 45°. In addition, the liquid stream is dispensed onto the surface of the IC wafer with relatively low pressure according to another aspect of the present invention.

The present invention may be used to particular advantage when the liquid is developer solution dispensed on the surface of the IC wafer for developing photoresist deposited on the surface of the IC wafer.

In this manner, the nozzle of the present invention dispenses liquid onto the surface of the IC wafer with minimized back-splash to reduce bubble defects within the integrated circuit fabricated on the surface of the IC wafer. The angling of the liquid stream toward the velocity vector on the IC wafer as the IC wafer spins reduces back-splash when the liquid stream hits the IC wafer. In addition, the liquid stream is applied onto the surface of the IC wafer with relatively low pressure.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. For example the nozzle passages FIGS. 1, 2, 3, 4, 5, 6, 7, 8, and 9 are shown to be relatively large for clarity of illustration. However, a typical size of each of such nozzle passages is approximately 0.5 millimeters. Elements having the same reference number in FIGS. 1, 2, 3, 4, 5, 6, 7, 8, and 9 refer to elements having similar structure and function.

DETAILED DESCRIPTION

Figure 1:
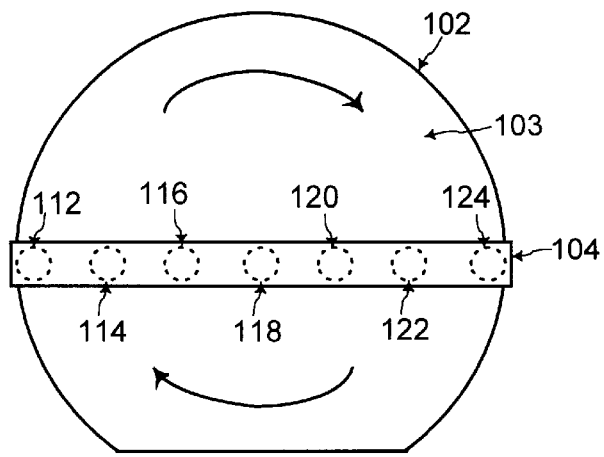
FIG. 1 shows a top view of a prior art nozzle used for dispensing liquid onto an IC (Integrated Circuit) wafer.
Figure 2:
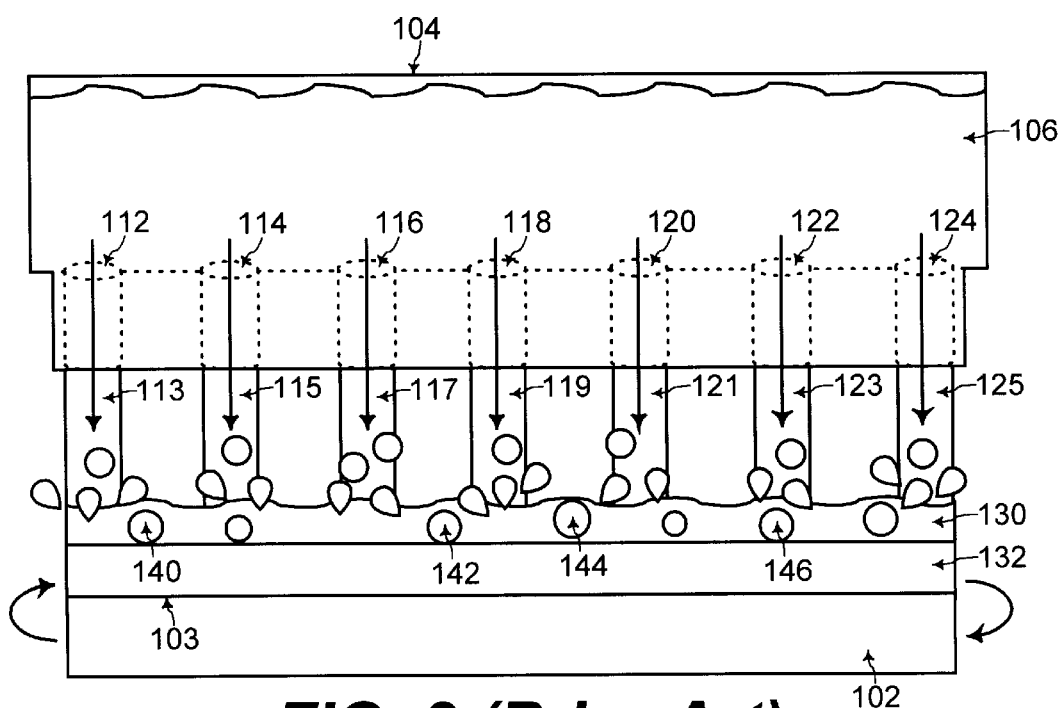
FIG. 2 shows a side view of the prior art nozzle of FIG. 1 in operation for dispensing liquid onto the IC wafer of FIG. 1.
Figure 3:
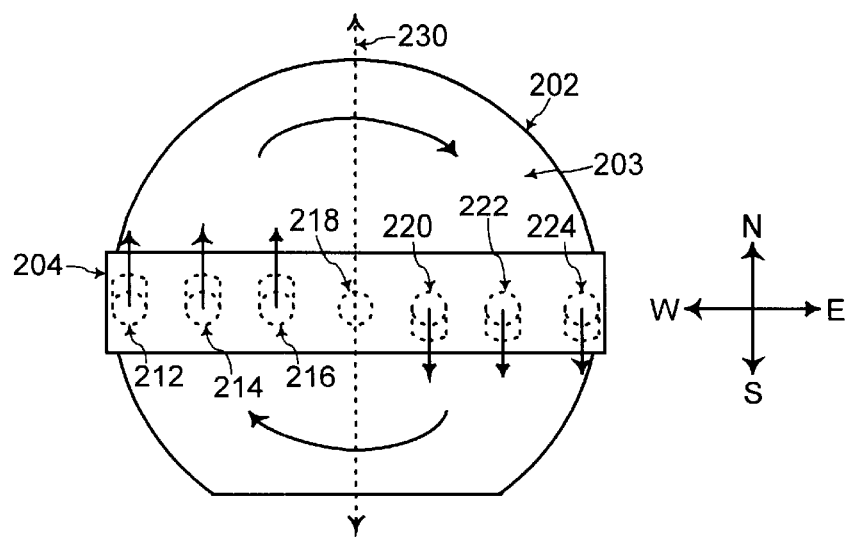
FIG. 3 shows a top view of a nozzle having angled nozzle passages used for dispensing liquid onto an IC (Integrated Circuit) wafer with minimized back-splash when the IC wafer is spinning in the clockwise direction, according to an embodiment of the present invention.
Figure 4:
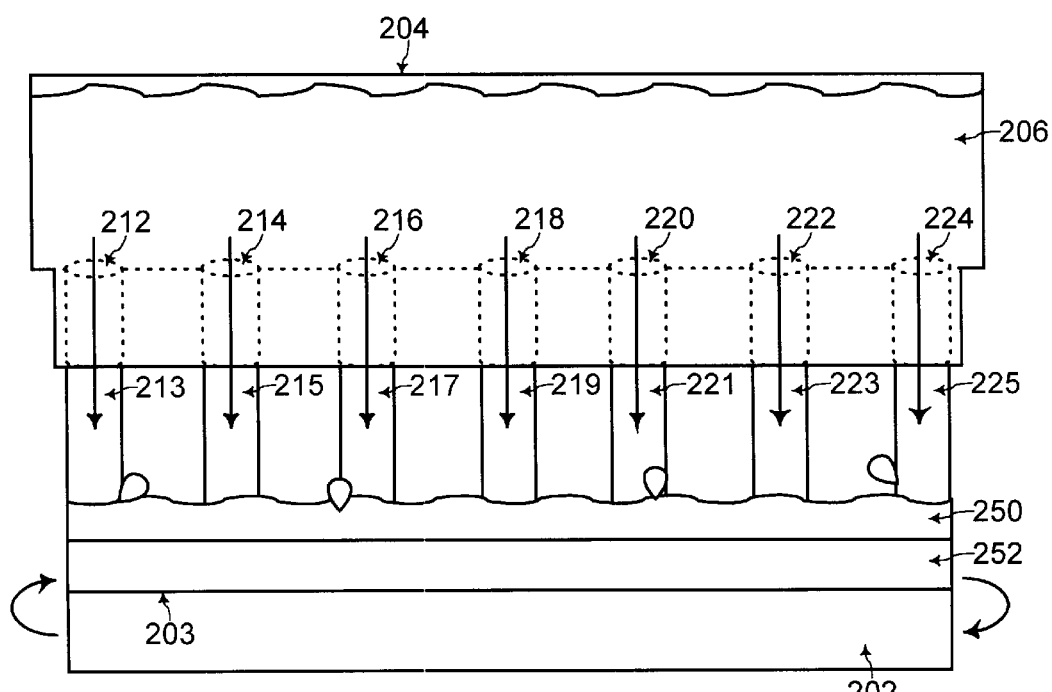
FIG. 4 shows a side view from the south side of the nozzle of FIG. 3 in operation for dispensing liquid onto the IC wafer at an angle to minimize back-splash when the IC wafer is spinning in the clockwise direction, according to an embodiment of the present invention.

Referring to FIG. 3, liquid such as solution used for fabrication of integrated circuits on an IC (Integrated Circuit) wafer 202 is dispensed from a nozzle 204 of an embodiment of the present invention onto a surface 203 of the IC wafer 202 as the IC wafer 202 spins. FIG. 3 shows a top view of the nozzle 204 placed across the diameter of the surface 203 of the IC wafer 202. FIG. 4 shows a side view from the south direction of the nozzle 204 that is placed across the diameter of the surface 203 of the IC wafer 202 of FIG. 3.

Referring to FIGS. 3 and 4, the nozzle 204 of an embodiment of the present invention includes a liquid chamber 206 that fills up with the liquid to be dispensed onto the surface 203 of the IC wafer 202. In addition, the nozzle 204 of an embodiment of the present invention includes a plurality of nozzle passages that carry and direct the liquid from the liquid chamber 206 onto the surface 203 of the IC wafer 202. The nozzle 204 includes a first nozzle passage 212, a second nozzle passage 214, a third nozzle passage 216, a fourth nozzle passage 218, a fifth nozzle passage 220, a sixth nozzle passage 222, and a seventh nozzle passage 224.

In contrast to the prior art, each of these plurality of nozzle passages 212, 214, 216, 218, 220, 222, and 224 in the nozzle 204 of an embodiment of the present invention are directed downward at an angle with respect to the surface 203 of the IC wafer 202 as the IC wafer 202 spins. Each of the nozzle passages 212, 214, 216, 218, 220, 222, and 224 in the nozzle 204 carries and directs a respective liquid stream of the liquid from the liquid chamber 206 toward the surface 203 of the IC wafer 202 as the IC wafer 202 spins (for example in the clockwise direction as illustrated in FIGS. 3 and 4).

Thus, the first nozzle passage 212 carries and directs a first liquid stream 213 from the liquid chamber 206 toward the surface 203 of the IC wafer 202. Similarly, the second nozzle passage 214 carries and directs a second liquid stream 215 from the liquid chamber 206 toward the surface 203 of the IC wafer 202. The third nozzle passage 216 carries and directs a third liquid stream 217 from the liquid chamber 206 toward the surface 203 of the IC wafer 202. The fourth nozzle passage 218 carries and directs a fourth liquid stream 219 from the liquid chamber 206 toward the surface 203 of the IC wafer 202. The fifth nozzle passage 220 carries and directs a fifth liquid stream 221 from the liquid chamber 206 toward the surface 203 of the IC wafer 202. The sixth nozzle passage 222 carries and directs a sixth liquid stream 223 from the liquid chamber 206 toward the surface 203 of the IC wafer 202. The seventh nozzle passage 224 carries and directs a seventh liquid stream 225 from the liquid chamber 206 toward the surface 203 of the IC wafer 202.

The respective liquid stream from each of the nozzle passages 212, 214, 216, 218, 220, 222, and 224 in the nozzle 204 is from a respective location on the nozzle to a respective spot on the surface 203 of the IC wafer 202 as the IC wafer 202 spins. Each of the nozzle passages 212, 214, 216, 218, 220, 222, and 224 in the nozzle 204 is disposed within the nozzle 204 at a respective angle with respect to the surface 203 of the IC wafer 202 such that the respective liquid stream from the nozzle passage is directed toward a velocity vector at the respective spot on the surface 203 of the IC wafer 202 where the respective liquid stream hits the surface 203 of the IC wafer 202.

Referring to FIGS. 3 and 4 for example, each of the plurality of nozzle passages 212, 214, 216, 218, 220, 222, and 224 in the nozzle 204 are aligned in a linear configuration to face the surface 203 of the IC wafer 202 across a diameter of the IC wafer 202. If the IC wafer 202 were spinning in a clockwise direction (as illustrated in FIGS. 3 and 4), then the velocity vector at spots of the IC wafer 202 to the left of a center line 230 of the IC wafer 202 is in the north direction, and the velocity vector at spots of the IC wafer 202 to the right of the center line 230 of the IC wafer 202 is in the south direction.

Thus, a first plurality of nozzle passages including the first nozzle passage 212, the second nozzle passage 214, and the third nozzle passage 216 which are aligned in the linear configuration to the left of the center line 230 of the IC wafer 202 are angled toward the north direction to provide a respective liquid stream angled toward the north direction. Similarly, a second plurality of nozzle passages including the fifth nozzle passage 220, the sixth nozzle passage 222, and the seventh nozzle passage 224 which are aligned in the linear configuration to the right of the center line 230 of the IC wafer 202 are angled toward the south direction to provide a respective liquid stream angled toward the south direction.

The fourth nozzle passage 218 is a center nozzle passage disposed between the first plurality of nozzle passages 212, 214, and 216 and the second plurality of nozzle passages 220, 222, and 224. The fourth nozzle passage 218 is directed toward a center of the surface 203 of the IC wafer 202. A velocity vector does not exist at the center of the surface 203 of the IC wafer 202 since the IC wafer 202 spins about such a center. Thus, the fourth nozzle passage 218 is directed vertically downward to be perpendicular to the surface 203 of the IC wafer 202.

Thus, referring to FIG. 4 which shows a side view from the south side of the nozzle 204 of FIG. 3, the first liquid stream 213, the second liquid stream 215, and the third liquid stream 217 face inward (toward the paper and away from the reader). On the other hand, the fifth liquid stream 220, the sixth liquid stream 222, and the seventh liquid stream 224 face outward (away from the paper and toward the reader). The fourth liquid stream 219 is directed vertically downward to be perpendicular to the surface 203 of the IC wafer 202.

Figure 5:
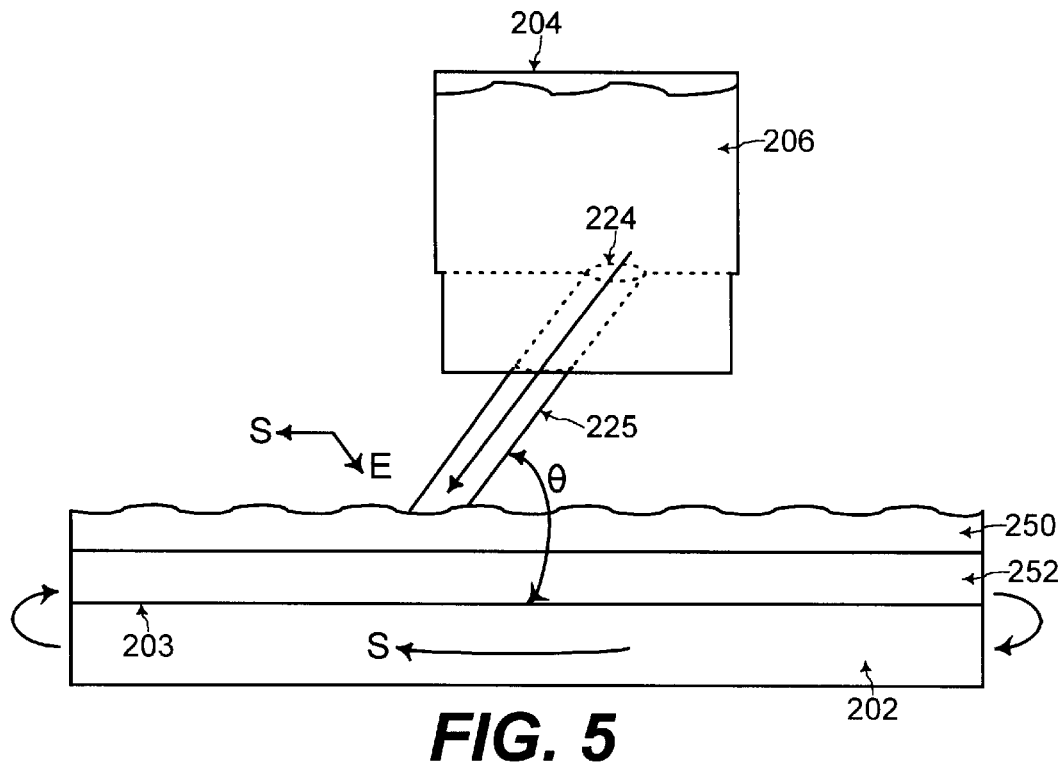
FIG. 5 shows a side view from the east side of the nozzle of FIG. 3 in operation for dispensing liquid onto the IC wafer at an angle to minimize back-splash when the IC wafer is spinning in the clockwise direction, according to an embodiment of the present invention.

For further illustration of such angling of the nozzle passages and the respective liquid streams, FIG. 5 shows a side view from the east side of the nozzle 204 of FIG. 3. Referring to FIGS. 3 and 5, the IC wafer 202 is spinning in the clockwise direction, and from the east side view of FIG. 3, the wafer 202 is spinning toward the left (i.e. toward the south direction). Thus, the velocity vector at spots toward the right (i.e. toward the east) of the center line 230 of the IC wafer 202 is directed toward the south direction. Thus, the seventh nozzle passage 224 (similar to the fifth nozzle passage 220 and the sixth nozzle passage 222) which is disposed to the right of the center line 230 is also angled toward the left (i.e. toward the south direction) which is also toward the velocity vector at spots toward the right (i.e. toward the east) of the center line 230 of the IC wafer 202.

Referring to FIG. 5, the seventh nozzle passage 224 (along with the respective seventh liquid stream 225) may be directed at an angle of $\theta=45°$ for example with respect to the surface 203 of the IC wafer 202. Similarly, the fifth nozzle passage 220 and the sixth nozzle passage 222 may also be directed at an angle of $\theta=45°$ for example with respect to the surface 203 of the IC wafer 202.

Figure 6:
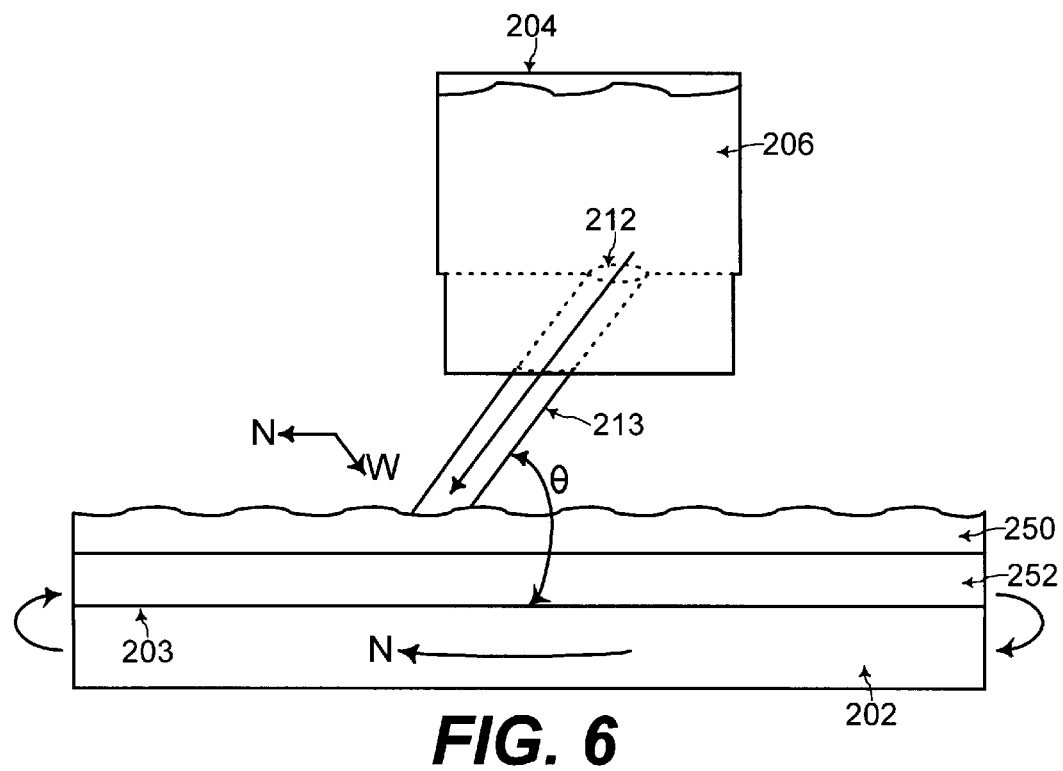
FIG. 6 shows a side view from the west side of the nozzle of FIG. 3 in operation for dispensing liquid onto the IC wafer at an angle to minimize back-splash when the IC wafer is spinning in the clockwise direction, according to an embodiment of the present invention.

On the other hand, FIG. 6 shows a side view from the west side of the nozzle 204 of FIG. 3. Referring to FIGS. 3 and 6, the IC wafer 202 is spinning in the clockwise direction, and from the west side view of FIG. 3, the wafer 202 is spinning toward the left (i.e. toward the north direction). Thus, the velocity vector at spots toward the left (i.e. toward the west) of the center line 230 of the IC wafer 202 is directed toward the north direction. Thus, the first nozzle passage 212 (similar to the second nozzle passage 214 and the third nozzle passage 216) which is disposed to the left of the center line 230 is also angled toward the left (i.e. toward the north direction) which is also toward the velocity vector at spots toward the left (i.e. toward the west) of the center line 230 of the IC wafer 202.

Referring to FIG. 6, the first nozzle passage 212 (along with the respective first stream 213) may be directed at an angle of θ=45° for example with respect to the surface 203 of the IC wafer 202. Similarly, the second nozzle passage 214 and the third nozzle passage 216 may also be directed at an angle of θ=45° for example with respect to the surface 203 of the IC wafer 202.

Figure 7:
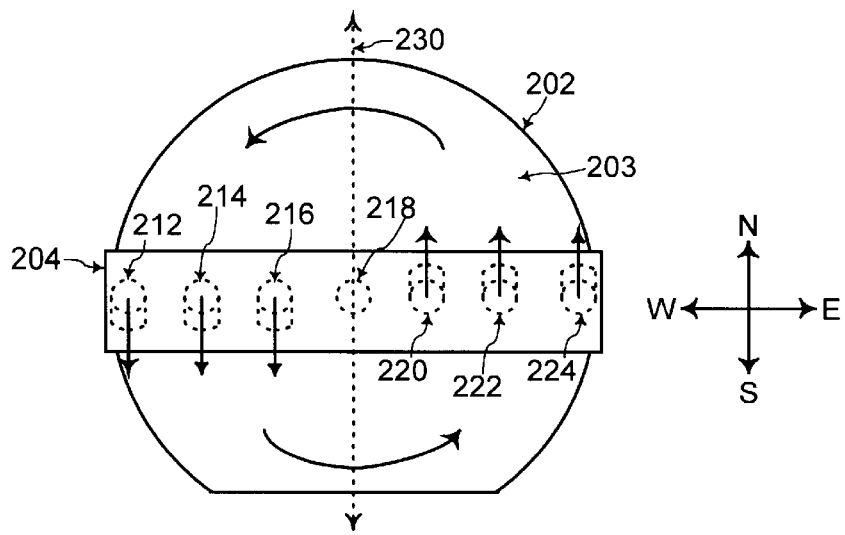
FIG. 7 shows a top view of a nozzle having angled nozzle passages used for dispensing liquid onto an IC (Integrated Circuit) wafer with minimized back-splash when the IC wafer is spinning in the counter-clockwise direction, according to an embodiment of the present invention.

Alternatively, referring to FIG. 7, if the IC wafer 202 were spinning in the counter-clockwise direction, then the velocity vector at spots of the IC wafer 202 to the left of the center line 230 of the IC wafer 202 is in the south direction, and the velocity vector at spots of the IC wafer 202 to the right of the center line 230 of the IC wafer 202 is in the north direction. Thus, the first plurality of nozzle passages including the first nozzle passage 212, the second nozzle passage 214, and the third nozzle passage 216 which are aligned in the linear configuration to the left of the center line 230 of the IC wafer 202 are angled toward the south direction to provide a respective liquid stream angled toward the south direction. Similarly, the second plurality of nozzle passages including the fifth nozzle passage 220, the sixth nozzle passage 222, and the seventh nozzle passage 224 which are aligned in the linear configuration to the right of the center line 230 of the IC wafer 202 are angled toward the north direction to provide a respective liquid stream angled toward the north direction. The fourth nozzle passage 218, which is directed toward the center of the surface 203 of the IC wafer 202, is directed vertically downward to be perpendicular to the surface 203 of the IC wafer 202.

Figure 8:
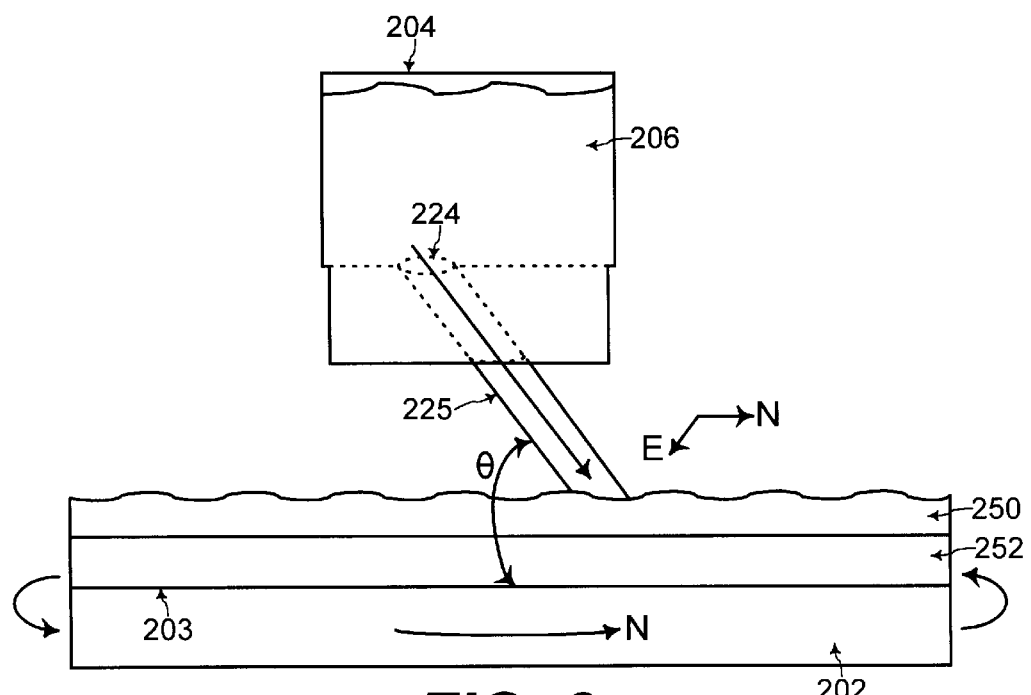
FIG. 8 shows a side view from the east side of the nozzle of FIG. 7 in operation for dispensing liquid onto the IC wafer at an angle to minimize back-splash when the IC wafer is spinning in the counter-clockwise direction, according to an embodiment of the present invention.

FIG. 8 shows a side view from the east side of the nozzle 204 of FIG. 7. Referring to FIGS. 7 and 8, the IC wafer 202 is spinning in the counter-clockwise direction, and from the east side view of FIG. 7, the wafer 202 is spinning toward the right (i.e. toward the north direction). Thus, the velocity vector at spots toward the right (i.e. toward the east) of the center line 230 of the IC wafer 202 is directed toward the north direction. Thus, the seventh nozzle passage 224 (similar to the fifth nozzle passage 220 and the sixth nozzle passage 222) which is disposed to the right of the center line 230 is also angled toward the right (i.e. toward the north direction) which is also toward the velocity vector at spots toward the right (i.e. toward the east) of the center line 230 of the IC wafer 202.

Referring to FIG. 8, the seventh nozzle passage 224 (along with the respective seventh liquid stream 225) may be directed at an angle of θ=45° for example with respect to the surface 203 of the IC wafer 202. Similarly, the fifth nozzle passage 220 and the sixth nozzle passage 222 may also be directed at an angle of θ=45° for example with respect to the surface 203 of the IC wafer 202.

Figure 9:
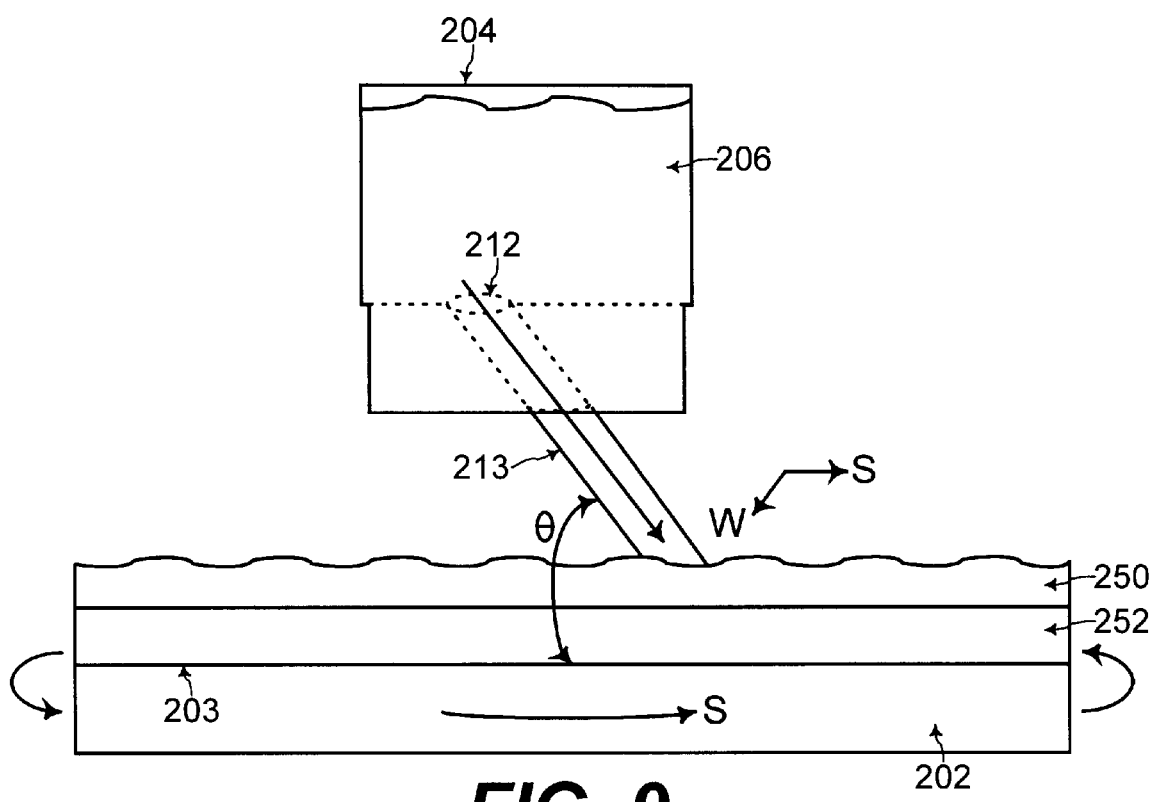
FIG. 9 shows a side view from the west side of the nozzle of FIG. 7 in operation for dispensing liquid onto the IC wafer at an angle to minimize back-splash when the IC wafer is spinning in the counter-clockwise direction, according to an embodiment of the present invention.

On the other hand, FIG. 9 shows a side view from the west side of the nozzle 204 of FIG. 7. Referring to FIGS. 7 and 9, the IC wafer 202 is spinning in the counter-clockwise direction, and from the west side view of FIG. 7, the wafer 202 is spinning toward the right (i.e. toward the south direction). Thus, the velocity vector at spots toward the left (i.e. toward the west) of the center line 230 of the IC wafer 202 is directed toward the south direction. Thus, the first nozzle passage 212 (similar to the second nozzle passage 214 and the third nozzle passage 216) which is disposed to the left of the center line 230 is also angled toward the right (i.e. toward the south direction) which is also toward the velocity vector at spots toward the left (i.e. toward the west) of the center line 230 of the IC wafer 202.

Referring to FIG. 9, the first nozzle passage 212 (along with the respective first stream 213) may be directed at an angle of θ=45° for example with respect to the surface 203 of the IC wafer 202. Similarly, the second nozzle passage 214 and the third nozzle passage 216 may also be directed at an angle of θ=45° for example with respect to the surface 203 of the IC wafer 202.

In this manner, referring to FIG. 4, the angling of the liquid streams toward the velocity vector on the IC wafer 202, as the IC wafer 202 spins, reduces back-splash when the liquid streams hit a layer of liquid 250 that is dispensed onto the surface 203 of the IC wafer 202 from the nozzle 204. Thus, bubble formation is minimized within the layer of liquid 250 to reduce bubble defects within the integrated circuit fabricated on the surface 203 of the IC wafer 202. For example, the layer of liquid 250 may be developer solution for developing a layer of photoresist 252 deposited on the surface 203 of the IC wafer 202. With such minimization of bubble formation within the layer of liquid 250, the layer of photoresist 252 is more likely to be properly developed uniformly across the whole surface of the IC wafer 202.

In addition to being directed toward the surface 203 of the IC wafer 202 at an angle, the liquid streams 213, 215, 217, 219, 221, 223, and 225 according to a preferred embodiment of the present invention are dispensed with relatively low pressure to further minimize back-splash and thus bubble formation within the layer of liquid 250.

The foregoing is by way of example only and is not intended to be limiting. For instance, the nozzle 204 of the present invention may be advantageously practiced with more numerous nozzle passages than illustrated in FIGS. 3, 4, and 7, as would be apparent to one of ordinary skill in the art from the description herein. In addition, the liquid dispensed with the nozzle 204 of the present invention may be any type of solution used for fabrication of integrated circuits on the IC wafer aside from the example of developer solution for developing a layer of photoresist.

Furthermore, as will be understood by those skilled in the art, the structures described herein may be made or used in the same way regardless of their position and orientation. Accordingly, it is to be understood that terms and phrases such as "right," "left," "north," "south," "west," and "east" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A nozzle system for dispensing liquid onto a surface of an IC (Integrated Circuit) wafer with minimized back-splash, the nozzle system comprising:

a liquid chamber that fills up with said liquid to be dispensed onto said surface of said IC wafer that is spinning about a center of said surface of said IC wafer; and a plurality of nozzle passages, wherein each nozzle passage carries and directs said liquid from said liquid chamber toward said surface of said IC wafer to provide a respective liquid stream from a respective location on said nozzle to a respective spot on said surface of said IC wafer as said IC wafer is spinning about said center;

wherein a velocity vector at any location of said surface of said IC wafer west of said center of said surface of said IC wafer is in a north direction when said surface of said IC wafer is spinning about said center in a clockwise direction;

and wherein a velocity vector at any location of said surface of said IC wafer east of said center of said surface of said IC wafer is in a south direction when said surface of said IC wafer is spinning about said center in a clockwise direction;

and wherein a velocity vector at any location of said surface of said IC wafer west of said center of said surface of said IC wafer is in a south direction when said surface of said IC wafer is spinning about said center in a counter-clockwise direction;

and wherein a velocity vector at any location of said surface of said IC wafer east of said center of said surface of said IC wafer is in a north direction when said surface of said IC wafer is spinning about said center in a counter-clockwise direction;

and wherein each nozzle passage disposed west of said center of said surface of said IC wafer is angled toward a north direction when said surface of said IC wafer is spinning about said center in a clockwise direction, and wherein each nozzle passage disposed east of said center of said surface of said IC wafer is angled toward a south direction when said surface of said IC wafer is spinning about said center in a clockwise direction, and wherein each nozzle passage disposed west of said center of said surface of said IC wafer is angled toward a south direction when said surface of said IC wafer is spinning about said center in a counter-clockwise direction, and wherein each nozzle passage disposed east of said center of said surface of said IC wafer is angled toward a north direction when said surface of said IC wafer is spinning about said center in a counter-clockwise direction, such that said respective liquid stream from each nozzle passage is directed toward a velocity vector at said respective spot on said surface of said IC wafer where said respective liquid stream hits said surface of said IC wafer to minimize back-splash of said liquid from said surface of said IC wafer.

2. The nozzle system of claim 1, further comprising:

developer solution contained within said liquid chamber and dispensed on said surface of said IC wafer for developing photoresist deposited on said surface of said IC wafer, wherein said minimized back-splash results in minimized bubble formation within said developer solution dispensed on said surface of said IC wafer.

3. The nozzle system of claim 1, wherein said respective angle of each nozzle passage with respect to said surface of said IC wafer is 45°.

4. The nozzle system of claim 1, wherein said plurality of nozzle passages are aligned in a linear configuration to face said surface of said IC wafer across a diameter of said IC wafer.

5. The nozzle system of claim 4, wherein said IC wafer is spinning in a clockwise direction about said center, and wherein a first plurality of nozzle passages are aligned in said linear configuration to a west of said center of said IC wafer with each of said first plurality of nozzle passages providing a respective liquid stream that is angled toward a north direction, and wherein a second plurality of nozzle passages are aligned in said linear configuration to a east of said center of said IC wafer with each of said second plurality of nozzle passages providing a respective liquid stream that is angled toward a south direction.

6. The nozzle system of claim 5, further comprising:

a center nozzle passage disposed between said first plurality of nozzle passages and said second plurality of nozzle passages in said linear configuration, wherein said center nozzle passage is perpendicular to said surface of said IC wafer above said center of said IC wafer.

7. The nozzle system of claim 4, wherein said IC wafer is spinning in a counter-clockwise direction about said center, and wherein a first plurality of nozzle passages are aligned in said linear configuration to a west of said center of said IC wafer with each of said first plurality of nozzle passages providing a respective liquid stream that is angled toward a south direction, and wherein a second plurality of nozzle passages are aligned in said linear configuration to a east of said center of said IC wafer with each of said second plurality of nozzle passages providing a respective liquid stream that is angled toward a north direction.

8. The nozzle system of claim 7, further comprising:

a center nozzle passage disposed between said first plurality of nozzle passages and said second plurality of nozzle passages in said linear configuration, wherein said center nozzle passage is perpendicular to said surface of said IC wafer above said center of said IC wafer.

9. A nozzle system for dispensing liquid onto a surface of an IC (Integrated Circuit) wafer with minimized back-splash, the nozzle system comprising:

a liquid chamber that fills up with said liquid to be dispensed onto said surface of said IC wafer that is spinning about a center of said surface of said IC wafer; and means for providing a plurality of liquid streams, each liquid stream traveling from a respective location on said nozzle toward a respective spot on said surface of said IC wafer as said IC wafer is spinning about said center;

wherein a velocity vector at any location of said surface of said IC wafer west of said center of said surface of said IC wafer is in a north direction when said surface of said IC wafer is spinning about said center in a clockwise direction;

and wherein a velocity vector at any location of said surface of said IC wafer east of said center of said surface of said IC wafer is in a south direction when said surface of said IC wafer is spinning about said center in a clockwise direction;

and wherein a velocity vector at any location of said surface of said IC wafer west of said center of said surface of said IC wafer is in a south direction when said surface of said IC wafer is spinning about said center in a counter-clockwise direction;

and wherein a velocity vector at any location of said surface of said IC wafer east of said center of said surface of said IC wafer is in a north direction when said surface of said IC wafer is spinning about said center in a counter-clockwise direction;

and wherein each liquid stream directed to a location of said surface of said IC wafer disposed west of said center of said surface of said IC wafer is angled toward a north direction when said surface of said IC wafer is spinning about said center in a clockwise direction, and wherein each liquid stream directed to a location of said surface of said IC wafer disposed east of said center of said surface of said IC wafer is angled toward a south direction when said surface of said IC wafer is spinning about said center in a clockwise direction, and wherein each liquid stream directed to a location of said surface of said IC wafer disposed west of said center of said surface of said IC wafer is angled toward a south direction when said surface of said IC wafer is spinning about said center in a counter-clockwise direction, and wherein each liquid stream directed to a location of said surface of said IC wafer disposed east of said center of said surface of said IC wafer is angled toward a north direction when said surface of said IC wafer is spinning about said center in a counter-clockwise direction, such that each liquid stream is directed toward a velocity vector at said respective spot on said surface of said IC wafer where said liquid stream hits said surface of said IC wafer to minimize back-splash of said liquid from said surface of said IC wafer.

10. The nozzle system of claim 9, further comprising:

developer solution contained within said liquid chamber and dispensed on said surface of said IC wafer for developing photoresist deposited on said surface of said IC wafer, wherein said minimized back-splash results in minimized bubble formation within said developer solution dispensed on said surface of said IC wafer.

11. The nozzle system of claim 9, wherein said respective angle of a liquid stream with respect to said surface of said IC wafer is 45°.

\* \* \* \* \*